(12) United States Patent
Janssen et al.

(10) Patent No.: US 10,877,384 B1
(45) Date of Patent: Dec. 29, 2020

(54) RADIATION SHIELDING DEVICE AND APPARATUS COMPRISING SUCH SHIELDING DEVICE

(71) Applicant: ASML Netherlands B.V., Veldhoven (NL)

(72) Inventors: Franciscus Johannes Joseph Janssen, Geldrop (NL); Philippe Jacqueline Johannes Hubertus Anthonius Habets, Maastricht (NL); Güneş Nakiboğlu, Eindhoven (NL); Roger Wilhelmus Antonius Henricus Schmitz, Helmond (NL); Remco Van de Meerendonk, s-Hertogenbosch (NL); Joris Dominicus Bastiaan Johannes Van den Boom, Veldhoven (NL); Nicholas Peter Waterson, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/971,751

(22) PCT Filed: Feb. 21, 2019

(86) PCT No.: PCT/EP2019/054258
§ 371 (c)(1),
(2) Date: Aug. 21, 2020

(87) PCT Pub. No.: WO2019/170422
PCT Pub. Date: Sep. 12, 2019

(30) Foreign Application Priority Data

Mar. 6, 2018 (EP) .................................... 18160096

(51) Int. Cl.
*G03F 7/20* (2006.01)

(52) U.S. Cl.
CPC ...... *G03F 7/70891* (2013.01); *G03F 7/70033* (2013.01)

(58) Field of Classification Search
CPC ............. G03F 7/70033; G03F 7/70875; G03F 7/70883; G03F 7/70891
(Continued)

(56) References Cited

U.S. PATENT DOCUMENTS

| 8,835,039 B2 | 9/2014 | Teng et al. |
| 2001/0013580 A1 | 8/2001 | Buis et al. |

(Continued)

FOREIGN PATENT DOCUMENTS

| CN | 203642128 U | 6/2014 |
| CN | 103968418 A | 8/2014 |

(Continued)

OTHER PUBLICATIONS

Ole Andersen, European Patent Office International Searching Authority, International Search Report and Written Opinion, corresponding PCT Application No. PCT/EP2019/054258, dated Jul. 25, 2019, 16 pages total.

(Continued)

*Primary Examiner* — Colin W Kreutzer
(74) *Attorney, Agent, or Firm* — DiBerardino McGovern IP Group LLC

(57) ABSTRACT

An apparatus comprising a heat-sensitive device (F); a radiative element (RE), the radiative element in operation generating first electromagnetic radiation (ER), the first radiation propagating towards the heat-sensitive device; and a radiation-shielding device (20) arranged between the radiative element and the heat-sensitive device such that, in operation, the first radiation impinges on the radiation-shielding device. The radiation-shielding device comprises a first shield element (21) having a first fluid channel (215)

(Continued)

arranged therein, the first shield element having a first surface (213) and a second surface (214), the first surface being arranged closer to the radiative element than the second surface; and a second shield element (22) having a second fluid channel (225) arranged therein, the second shield element having a third surface (223) and a fourth surface (224), the third surface being arranged closer to the radiative element than the fourth surface. The first shield element is arranged closer to the radiative element than the second shield element and the second shield element is arranged closer to the heat-sensitive device than the first shield element, the first shield element and the second shield element spaced apart from each other and the second surface and the third surface opposing each other.

19 Claims, 4 Drawing Sheets

(58) Field of Classification Search
USPC .............................. 355/30, 67, 71
See application file for complete search history.

(56) References Cited

U.S. PATENT DOCUMENTS

| 2005/0069433 | A1* | 3/2005 | Hayashi | G03F 7/70808 |
|---|---|---|---|---|
| | | | | 417/423.4 |
| 2005/0122490 | A1 | 6/2005 | Luttikhuis et al. | |
| 2005/0257919 | A1 | 11/2005 | White | |
| 2011/0242515 | A1* | 10/2011 | Ceglio | G02B 5/10 |
| | | | | 355/67 |
| 2015/0229009 | A1 | 8/2015 | Gruenwald et al. | |
| 2015/0346612 | A1 | 12/2015 | Laufer et al. | |
| 2017/0022283 | A1 | 1/2017 | Tabuteau | |

FOREIGN PATENT DOCUMENTS

| CN | 105263297 | A | 1/2016 |
|---|---|---|---|
| CN | 105990621 | A | 10/2016 |
| CN | 205860833 | U | 1/2017 |
| CN | 106505223 | A | 3/2017 |
| DE | 102013219665 | A1 | 4/2015 |
| DE | 102014226479 | A1 | 6/2016 |
| EP | 0542534 | A1 | 5/1993 |
| JP | 2000353614 | A | 12/2000 |
| JP | 2013138118 | A | 7/2013 |
| JP | 2015149186 | A | 8/2015 |
| KR | 101779945 | B1 | 8/2015 |

OTHER PUBLICATIONS

Alice Ying et al., "Recent Progress in HCCB Design Analysis," ITER-TMB Technical Meeting, UCLA, Los Angeles, CA (Feb. 2007), available at http://www.fusion.ucla.edu/ITER-TBM/.

Farrokh Najmabadi, "Fusion: Bringing star power to earth," Grand Challenges Summit, Raleigh, NC (Mar. 2010), available at http://aries.ucsd.edu/NAJMABADI/TALKS/1003-NES.pdf.

Jean Genibrel, "Improve Cooling, Power and Reliability with Radiator Pressure," APPLIEDSPEED.com blog (Feb. 2017), available at http://appliedspeed.com/blogs/tech/improve-cooling-power-and-reliability-with-radiator-pressure.

"Part-C Main topics B1-Electronics cooling methods in industry," Mechanical Power Engineering Dept., Faculty of Engineering, Cairo University, Egypt (May 2010).

* cited by examiner

RADIATION SHIELDING DEVICE AND APPARATUS COMPRISING SUCH SHIELDING DEVICE

CROSS-REFERENCE TO RELATED APPLICATIONS

This application claims priority of EP application 18160096.6, which was filed on 6 Mar. 2018 and which is incorporated herein in its entirety by reference.

FIELD

The present invention relates to a radiation shielding device and apparatus comprising such shielding device. In particular, the radiation shielding device relates to a radiation shielding device through which a fluid may flow to remove heat generated by impinging radiation.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, for example 6.7 nm or 13.5 nm, may be used to form smaller features on a substrate than a conventional lithographic apparatus (which may for example use electromagnetic radiation with a wavelength of 193 nm).

With such smaller features being applied the lithographic apparatus has also to be designed to apply the features accurately for sufficient overlay performance, i.e. accurate positioning of layers, that are separately applied on top of each other, relative to each other. Any unexpected or uncontrolled mechanical deformations and vibrations may cause defects in the circuit being patterned and manufactured, which may be detrimental to the functionality of a manufactured integrated circuit.

In the lithographic apparatus there are however parts and devices that generate heat and consequently radiate electromagnetic radiation. Since the above-mentioned lithographic apparatus using EUV radiation may be interiorly kept substantially vacuum, i.e. at a very low pressure and thus convective heat transportation may be low, the radiated electromagnetic radiation may impinge on heat-sensitive parts and devices. The electromagnetic radiation may be absorbed and as a result the heat-sensitive parts may still be heated. Inevitably, the heating results in mechanical expansion and potentially mechanical deformations.

It is known to apply a plate-like shielding device having an interior through which a coolant liquid, such as but not limited to water, is flown. The shielding device may be arranged between the radiative elements, i.e. the parts and devices that may radiate during operation of the lithographic apparatus, and a heat-sensitive device. The radiation impinges on the shielding device. Heat generated in the shielding device as a consequence of the impinging and absorbed radiation is removed by the coolant liquid, preventing that the shielding device may heat up to the extent that the shielding device becomes a radiating device.

The shielding device is however limited in practical use, since the coolant liquid flow generates vibrations that may affect the accuracy, which becomes even more of a disadvantage with an increasing flow needed for further reduction of temperature variations in the heat-sensitive device, which is needed for the above-mentioned smaller features. Similarly, the closed plate-like structure of the known shielding device divides the interior in separate environments, which may be disadvantage in certain applications. In general, the known shielding device has a limited scope of applicability.

SUMMARY

It may be desirable to provide a lithographic apparatus which addresses the problem identified above or some other problem associated with the prior art. In particular, a shielding device with a larger scope of applicability may be desirable.

In accordance with one embodiment of the invention, provision is made of an apparatus comprising a heat-sensitive device, a radiative element, and a radiation-shielding device. The radiative element generates first electromagnetic radiation, when the radiative element is in operation. The first electromagnetic radiation propagates at least towards the heat-sensitive device. The radiation-shielding device is arranged between the radiative element and the heat-sensitive device such that, in operation, the first radiation impinges on the radiation-shielding device. The radiation-shielding device comprises a first shield element, which first shield element has a first fluid channel arranged therein and has a first surface and a second surface. The first surface is arranged closer to the radiative element than the second surface. The radiation-shielding device further comprises a second shield element, which second shield element has a second fluid channel arranged therein and has a third surface and a fourth surface. The third surface is arranged closer to the radiative element than the fourth surface. The first shield element is arranged closer to the radiative element than the second shield element and the second shield element is arranged closer to the heat-sensitive device than the first shield element. The first shield element and the second shield element are spaced apart from each other and the second surface and the third surface are opposing each other.

In this way, having at least two layers of shielding, much more applications for shielding against electromagnetic radiation are enabled, a few of which are described in detail hereinbelow. Still, other applications are contemplated too.

In an embodiment, the first shield element is provided with a first fluid port and a second fluid port for flowing a fluid through the first fluid channel and the second shield element is provided with a third fluid port and a fourth fluid port for flowing a fluid through the second fluid channel. Thus, the shield elements may be coupled to a fluid supply and fluid drain for flowing a fluid, i.e. either a liquid medium or a gaseous medium, through at least one of the shield elements for temperature control. In particular, any heat received or generated, for example due to the electromagnetic radiation impinging on the shield element, may be removed through the fluid flowing through the fluid channel of the shield element. In an embodiment, the fluid is employed to maintain at least one of the shield elements at a predetermined temperature or at least at a temperature within a predetermined temperature range.

In an embodiment, a fluid conditioning system is coupled to the fluid ports of at least one of the first and the second shield element for conditioning the fluid and flowing the fluid through the fluid channel of said at least one of the first and the second shield element. In another embodiment, the second fluid port and the third fluid port are coupled and a fluid conditioning system is coupled to the first fluid port and the fourth fluid port for conditioning the fluid and flowing the fluid through the first and the second fluid channel. Either of these embodiments is enabled for accurate temperature control of the radiation-shielding device in order to prevent that the radiation-shielding device provides for an undesired heat load on the heat-sensitive device.

In an embodiment, the radiation-shielding device extends in a shielding plane, wherein the shielding plane is transverse to a radiation direction. The radiation direction extends from the radiative element to the heat-sensitive device. In this embodiment, the radiation-shielding device is configured and arranged to block any electromagnetic radiation from propagating directly from the radiative element to the heat-sensitive device. The electromagnetic radiation will impinge on the radiation-shielding device instead of impinging on the heat-sensitive device. The electromagnetic radiation may completely or partly be absorbed by the radiation-shielding device, thereby heating the radiation-shielding device. The generated heat may be removed by a fluid flowing through the fluid channel. It is noted that, in an embodiment, the shielding plane may be under an angle different than (exactly) 90 degrees. Depending on the requirements, any other suitable angle may be selected to shield the heat-sensitive device from the electromagnetic radiation. Further, if more than one radiative element is present, an orientation of the shielding plane may be suitably selected relative to both radiative elements such that the resulting heat transfer towards the heat-sensitive device remains within predetermined limits.

It is noted that with the use of a single shield element through which a fluid flows it is possible to remove the generated heat. In particular, by increasing the flow of fluid, it is possible to remove more heat. However, with increasing flow, vibrations caused by the flow increase as well. In vibrational sensitive systems, such increase in vibrations is undesirable. A flow of fluid through the radiation-shielding device according to the present invention is significantly reduced, while increasing a heat removal capacity of the radiation-shielding device. Thus, surprisingly, the radiation-shielding device according to the present invention has an improved heat removal capacity with a reduction in vibration generation.

In a particular embodiment, the first shield element is provided with a first through hole, the through hole extending in parallel to the shielding plane, and the second shield element is provided with a second through hole, the second through hole extending in parallel to the shielding plane. Further, the first through hole and the second through hole are arranged such that electromagnetic radiation propagating in the radiation direction and passing through the first through hole impinges on the second shield element. In other words, the electromagnetic radiation is prevented from passing through both the first through hole and the second through hole. The electromagnetic radiation propagating from the radiative element towards the heat-sensitive device in the radiation direction does not reach the heat-sensitive device, but either impinges on the first shield element or passes through the first through hole to impinge on the second shield element. However, any fluid such as a gaseous medium may flow through the first through hole and the second through hole such that environmental properties, such as a gas pressure and gas mixture, on both sides of the radiation-shielding device are substantially equal.

In an exemplary embodiment, an interferometer system is arranged on a first side of the radiation-shielding device and a wavelength tracking system is arranged on the heat-sensitive device at a second side of the radiation-shielding device, wherein the second side is opposite to the first side. The wavelength tracking system may be employed for calibrating the interferometer. However, in order to achieve an accurate calibration, it is needed that similar environmental conditions apply, i.e. a similar gas pressure, gas temperature, gas mixture, etc. Having through holes extending from the first side of the radiation-shielding device to the opposing second side allows such conditions to be similar on both sides, while electromagnetic radiation that may negatively affect temperature stability of the heat-sensitive device is blocked and any generated heat is removed.

The apparatus according to the present invention may be very suitable for use in optical systems and in particular in lithographic system, in which temperature control and vibration control are important to improve positional accuracy of the projected beam. In such an embodiment, the apparatus is provided with an optical system for projecting a beam of electromagnetic radiation on a substrate and the optical system may be coupled to the heat-sensitive device. The optical system may comprise different parts and elements such as one or more optical elements like a lens and a mirror, positioning devices for positioning an optical element and a measurement device for measuring a position of an optical element. In particular, the heat-sensitive device may be a frame supporting at least a part of such an optical system. Any heat load on the frame would incur an expansion of the frame. Preventing such a heat load on the frame directly improves the positional accuracy of the beam projected by (the part of) the optical system supported by the frame. Similarly, any vibrations are preferably prevented in the frame. Therefore, it is preferred that any source of vibrations are eliminated from the apparatus or at least the amount of vibrations is reduced or the vibrations are sufficiently controlled with respect to frequency and/or amplitude. In a particular embodiment, the projected beam of electromagnetic radiation comprises EUV radiation having a wavelength in a range of 4-20 nm.

In an embodiment, the radiative element is one of the elements comprised in a group of radiative elements, the group comprising a cable, a tube and an actuator. Common sources of heat load is cabling, tubing and actuators. As apparent to those skilled in the art, such cabling, tubing and actuators cannot be prevented in the apparatus and cannot be prevented from generating heat and corresponding electromagnetic radiation. Using the radiation-shielding device according to the present invention prevents negative effects of such heat load and radiation, while at the same time reducing vibrations generated by prior art radiation-shielding devices.

In an aspect, the present invention provides a radiation-shielding device for use in the apparatus according to the invention. The radiation shielding device is configured for protecting a heat-sensitive device against electromagnetic radiation from a radiative element and comprises a first shield element and a second shield element. The first shield element has a first fluid channel arranged therein and has a first surface and a second surface. The second shield element has a second fluid channel arranged therein and has a third surface and a fourth surface. The first shield element and the second shield element are spaced apart from each other and the second surface and the third surface are arranged opposing each other.

In a further aspect, the present invention provides method of protecting a heat-sensitive device against electromagnetic radiation from a radiative element. The method comprises arranging a first shield element having a first fluid channel arranged therein between the radiative element and the heat-sensitive device, the first shield element having a first surface and a second surface; arranging a second shield element having a second fluid channel arranged therein between the first shield element and the heat-sensitive device, the second shield element having a third surface and a fourth surface, such that the first shield element and the second shield element are arranged spaced apart from each other and the second surface and the third surface oppose each other; and flowing a fluid through the first fluid channel and the second fluid channel.

In an embodiment, the step of flowing a fluid through the first fluid channel and the second fluid channel further comprises conditioning the fluid flowing through at least one of the first fluid channel and the second fluid channel. Such conditioning may, for example, include controlling a temperature of the fluid flowing to such shield element.

Further, in an embodiment, the amount of flow may be controlled in dependence of a temperature difference between a temperature of the fluid flowing into a shield element and a temperature of the fluid flowing out of the shield element. Such control method may be applied in order to achieve a constant heat load to the heat-sensitive device independent of an amount of electromagnetic radiation originating from the radiative element. In another example, such control method may be applied in order to further reduce flow-induced vibrations by reducing the fluid flow when less electromagnetic radiation is incident on the radiation-shielding device.

Features described in the context of one aspect or embodiment described above may be used with others of the aspects or embodiments described above.

BRIEF DESCRIPTION OF THE DRAWINGS

Embodiments of the invention will now be described, by way of example only, with reference to the accompanying schematic drawings, in which.

DETAILED DESCRIPTION

Figure 1:
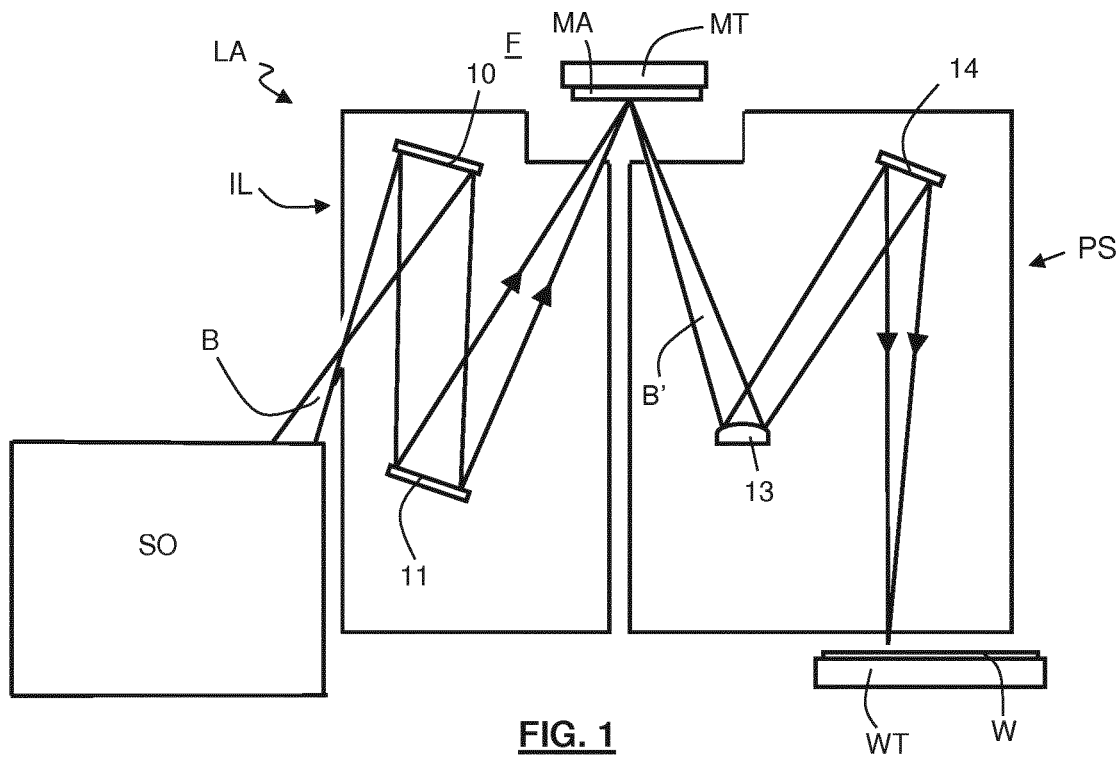
FIG. 1 depicts a lithographic system comprising a lithographic apparatus and a radiation source, FIGS. 2A and 2B schematically depict a first embodiment of an apparatus according to the present invention.

The features and advantages of the present invention will become more apparent from the detailed description set forth below when taken in conjunction with the drawings. In the drawings, like reference numbers generally indicate identical, functionally similar, and/or structurally similar elements.

This specification discloses one or more embodiments that incorporate the features of this invention. The disclosed embodiment(s) merely exemplify the invention. The scope of the invention is not limited to the disclosed embodiment (s). The invention is defined by the claims appended hereto.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 2A:
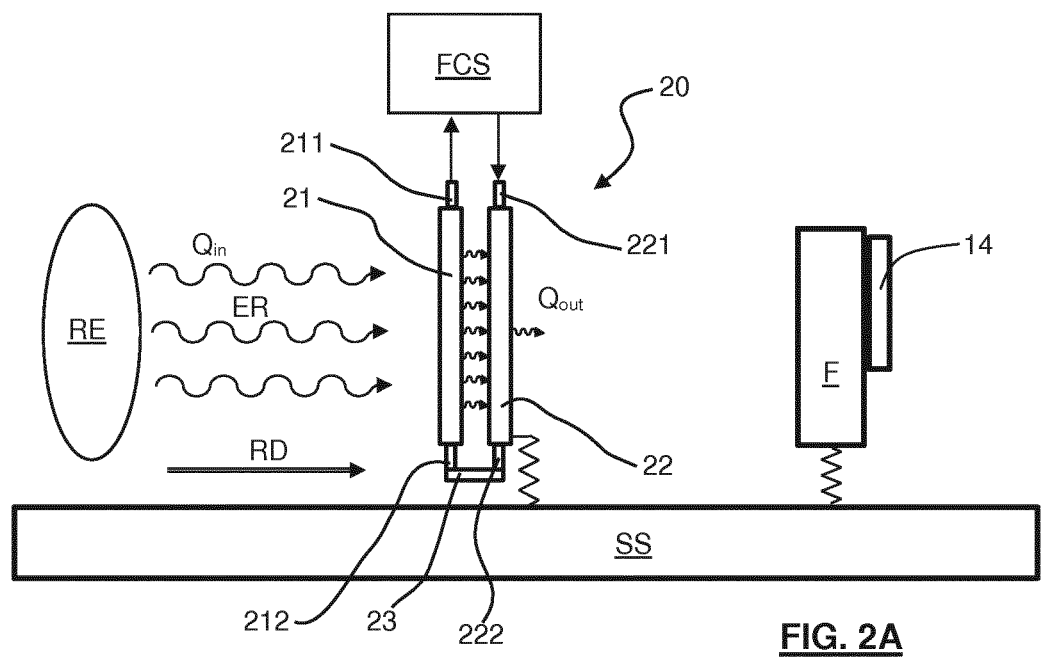

FIG. 2A shows a radiation-shielding device 20 according to the present invention. As an example, the radiation-shielding device 20 is arranged in the lithographic apparatus as shown in FIG. 1, while it is contemplated that the radiation-shielding device 20 may be used in any other kind of apparatus.

In the embodiment of FIG. 2A, a support structure SS supports the radiation-shielding device 20 and a frame F. The frame F supports a mirror 14 of the projection system PS of the lithographic apparatus LA as shown in FIG. 1. As an example, the frame F is illustrated and described as a heat-sensitive device shielded from radiation by the radiation-shielding device 20. It is noted that the radiation-shielding device 20 may however be used for shielding any other part of the lithographic apparatus LA as well.

The radiation-shielding device 20 is arranged between the frame F and a radiative element RE. The radiative element RE may be any kind of element that may generate electromagnetic radiation ER, which electromagnetic radiation ER may provide for an input heat load $Q_{in}$ when absorbed by an element or device. While the electromagnetic radiation ER may be radiated by the radiative element RE in any or all directions, in the present description only the electromagnetic radiation ER radiated in a radiation direction RD towards the heat-sensitive frame F is considered and described.

Figure 2B:
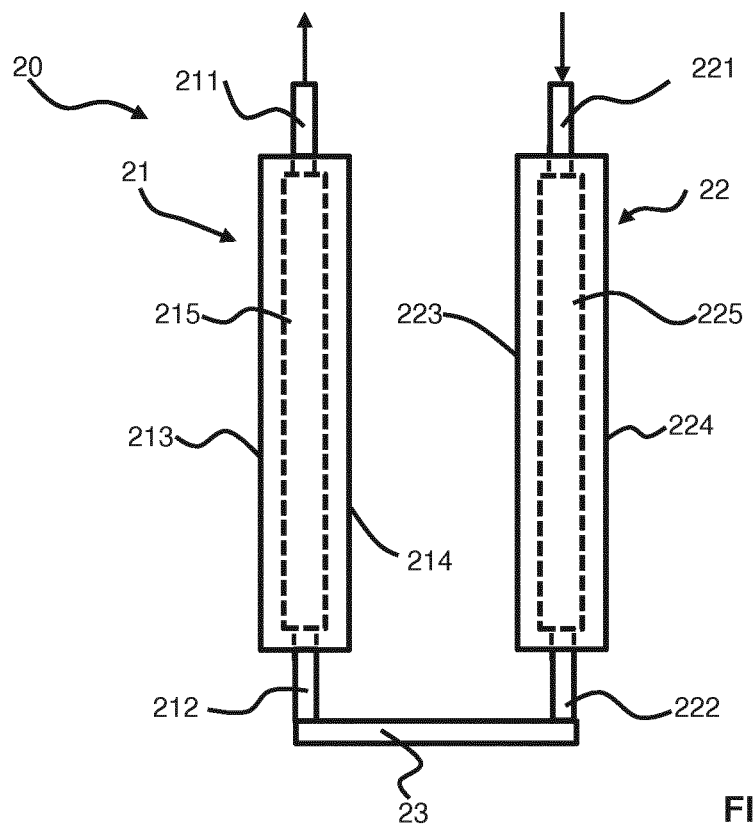

FIG. 2B shows the embodiment of the radiation-shielding device 20 shown in FIG. 2A in more detail. The radiation-shielding device 20 comprises a first shield element 21 and a second shield element 22. The first shield element 21 is provided with a first fluid channel 215 operatively coupled to a first fluid port 211 and a second fluid port 212. Further, the first shield element 21 has a first surface 213 and a second surface 214. The second shield element 22 is provided with a second fluid channel 225 operatively coupled to a third fluid port 221 and a fourth fluid port 222. Further, the second shield element 22 has a third surface 223 and a fourth surface 224. The first fluid channel 215 and the second fluid channel 225 are operatively coupled through a coupling channel 23. Thus, a fluid may be supplied through the third fluid port 221, flow through the first fluid channel 215 and the second fluid channel 225 and be drained through the first fluid port 211. In another embodiment, the coupling channel 23 may be omitted and separate flows may be generated through the first fluid channel 215 and the second fluid channel 225. Such an embodiment may be preferred if different fluids or different flow amounts are desired in view of the application, for example.

The radiation-shielding device 20 is coupled to a fluid conditioning system FCS. The fluid conditioning system FCS may be configured to circulate a fluid, e.g. water, through the radiation-shielding device 20 by supplying the fluid through the third fluid port 221 and receiving the fluid through the first fluid port 211. The fluid conditioning system FCS may be further configured to monitor and/or control a temperature of the circulating fluid. The fluid supplied to the radiation-shielding device 20 may be maintained at a predetermined temperature, for example, such to control a temperature of the radiation-shielding device 20. Alternatively or additionally, a temperature of the fluid returning from the radiation-shielding device 20 may be measured and based on a temperature difference with the supplied fluid an amount of incident electromagnetic radiation ER may be derived in order to determine an amount of flow of the fluid needed to protect the heat-sensitive element, in casu the frame F.

Referring to FIGS. 2A and 2B, the electromagnetic radiation ER propagating from the radiative element RE towards the heat-sensitive frame F impinges on the first surface 213 of the first shield element 21. At least a part of the electromagnetic radiation ER may be absorbed by the first shield element 21. Due to the absorbed radiation, the first surface 213 of the first shield element 21 is heated. The fluid flowing through the first fluid channel 215 may absorb at least a part of the generated heat and may transport the heat away through the first fluid port 211 to the fluid conditioning system FCS. Another part of the generated heat may however be transported to the second surface 214 where it may generate electromagnetic radiation that propagates from the second surface 214 towards the third surface 223. Due to the radiation impinging on the third surface 223, the second shield element 22 is heated. The fluid flowing through the second fluid channel 225 may remove at least a part of such heat. A remaining part of the heat may heat the fourth surface 224 due to which the fourth surface 224 will radiate electromagnetic radiation. This electromagnetic radiation may be considered to form an output heat load $Q_{out}$, which output heat load is provided to the frame F. A heat load suppression S of the radiation-shielding device 20 may thus be defined as $S=Q_{out}/Q_{in}$.

As apparent to those skilled in the art, the radiation-shielding device 20 may be further provided with a third shield element and even further shield elements which may further increase the heat load suppression.

As described hereinabove, a heat transfer may be generated by radiation. However, depending on the circumstances and properties, the heat may be transferred by convection and conduction as well. Still, a person skilled in the art will understand that conductive heat transport may be prevented significantly by suitable thermal isolation. Convective heat transport may be present, for example by a gaseous medium present in the environment of the radiative element RE, the radiation-shielding device 20 and/or the heat-sensitive frame F. It is noted that the radiation-shielding device 20 may be employed to reduce or prevent heat transfer by conduction and/or convection as well as by radiation. Moreover, in a particular embodiment, the heat transfer by conduction and/or convection may even be dominant over the radiative heat transfer. In another embodiment, when used in a vacuum environment, i.e. a low gas pressure environment, the radiation-shielding device 20 may be primarily employed to prevent radiative heat load reaching a heat-sensitive element. More in general, the radiation shielding device according to the present invention may be designed and used to provide for suitable reduction of any kind of heat transfer.

As apparent to those skilled in the art, in order to provide for thermal stability of the frame F, at least the fourth surface 224 of the second shield element 22 may be controlled to have a same temperature as the frame F, e.g. a predetermined set temperature. Therefore, a temperature of the fluid flowing through the second fluid channel 225 may be set at such predetermined set temperature. In an embodiment, the temperature of the fluid may be set slightly below the predetermined set temperature such that, with the heat generated due to the impinging radiation, the temperature of the fourth surface 224 corresponds to the predetermined set temperature.

Figure 3:
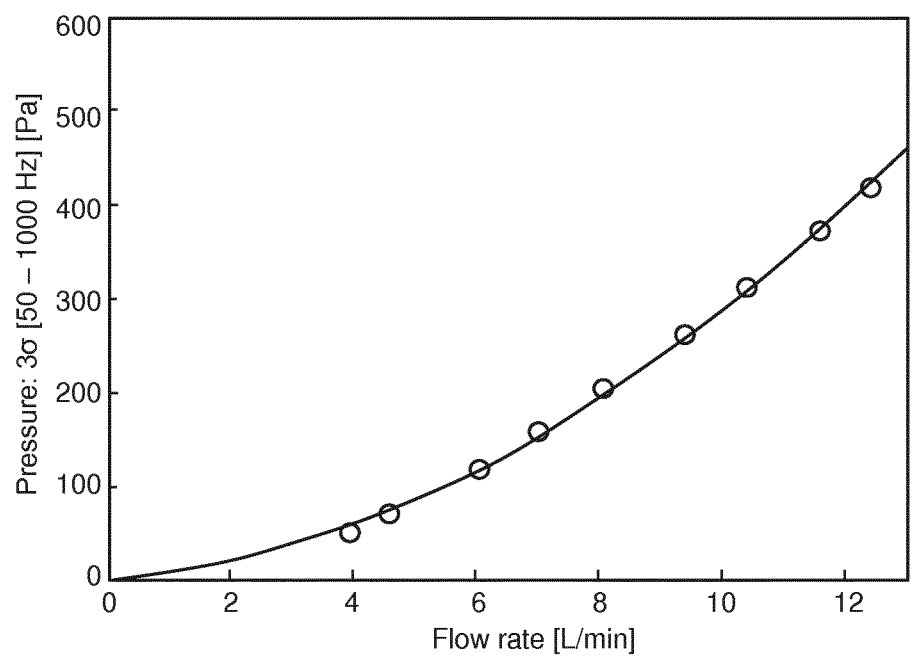
FIG. 3 depicts a graph illustrating an amount of flow-induced vibrations as a function of flow rate.

In the prior art it is known to apply a heat shield having a single shield element having a fluid channel. A heat load suppression may be increased in such prior art heat shield by increasing a fluid flow through such heat shield. However, with increased flow, an amount of flow-induced-vibrations is increased as well, as shown in FIG. 3. FIG. 3 shows a diagram with an amount of fluid flow through a shield element in litre per minute on the horizontal axis and pressure fluctuation in a frequency range of 50-1000 Hz in Pa on the vertical axis. The pressure fluctuation is represented by a 3σ value for the pressure, where σ is the standard deviation of the pressure over a predetermined frequency range. This pressure fluctuation is representative of the flow-induced vibrations. From FIG. 3, it is easily derivable that the flow-induced vibrations increase rapidly and significantly with an increasing fluid flow. For applications sensitive to mechanical instabilities like vibrations, such as a lithographic projection system, the flow-induced vibrations are preferably to be kept below a predetermined threshold, if not completely circumventable or preventable. At the same time, such mechanically sensitive systems may also be needed to be prevented from thermal expansion and contraction. Thus, such mechanically sensitive systems are preferably protected with a heat shield against heat load by radiation, convection and/or conduction. Moreover, in lithographic apparatus, with a desire to project even finer patterns, the mechanical accuracy requirements become tighter, which may require higher heat load suppression and a lower amount of vibrations. For a prior art heat shield the requirements with respect to heat load reduction and vibration reduction are however contradictory.

Figure 4:
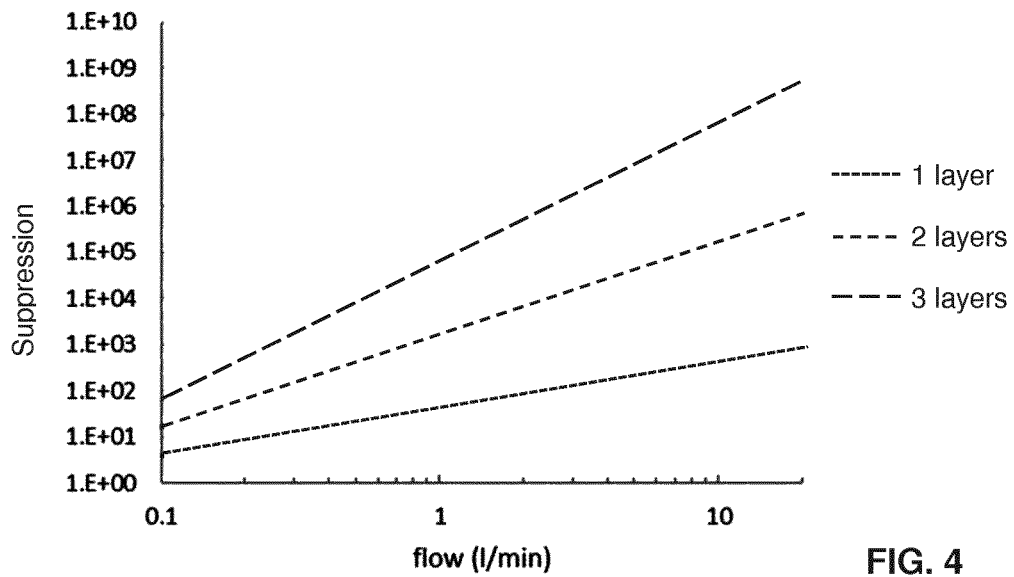
FIG. 4 depicts a graph illustrating a heat load suppression as a function of flow rate.

FIG. 4 shows a diagram showing a heat load suppression S (on the vertical axis with a logarithmic scale) in dependence of an amount of fluid flow (on the horizontal axis with a logarithmic scale, in litre per minute) through one, two or three layers of shield elements in accordance with the present invention. With a prior art single layer heat shield, the heat load suppression S with a fluid flow of about 10 l/min is about 400. A same heat load suppression S is obtainable with a two-layered shielding device with a fluid flow of about 0.5 l/min and with a three-layered shielding device with a fluid flow of less than 0.2 l/min. With reference to FIG. 3, a pressure fluctuation—representative of flow-induced vibrations—for a flow of about 10 l/min is slightly less than 300 Pa, while for a flow well below 1 l/min, the pressure variations are very small and may be considered insignificant, depending on the application. In any case, for a same heat load suppression S, the fluid flow may be considerably reduced resulting in a significant reduction in flow-induced-vibrations. Moreover, with a smaller flow, the fluid conditioning system may be simpler, the tubing may be smaller and other elements may be simpler and/or smaller and/or more cost-effective as well.

Moreover, with the mechanical requirements corresponding to the desire to provide for finer patterns with a correspondingly accurate positioning, the radiation-shielding device of the present invention may provide for an improved heat load suppression S, while reducing the flow-induced-vibrations, as compared to the single layered heat shield of the present invention. For example, if compared to the prior art heat shield with a flow of 10 l/min a ten times better heat load suppression S is required, a two layered radiation-shielding device according to the present invention would require a fluid flow of about 1.6 l/min would be needed. As derivable from FIG. 3, corresponding pressure fluctuation is about 10 Pa, while for 10 l/min the pressure fluctuation is about 400 Pa. Thus, with a heat load suppression increase of about 10 times, the flow-induced vibrations are reduced with a factor of about 40 times.

More in general, it is noted that the heat load suppression S for an ideal shield element is about S=40*flow, with the flow expressed in litres per minute. So, with a cascade of N shield elements, the heat load suppression becomes $S=(40*flow)^N$. Flow-induced vibrations (FiV) may be represented by $FiV=c_0*flow^2$, with $c_0$ a constant. The flow-induced vibrations do not multiply for multiple shield elements, but only add up due to the longer fluid channels. So, for a cascade of N shield elements, the flow-induced vibrations may be determined to be $FiV=N*c_0*flow^2$.

FIGS. 5A-5E show three embodiments of a shield element 21 for use in the shielding device 20 according to the present invention as either of the shield elements (e.g. 21 and 22 in FIGS. 2a and 2B) used therein. The shield element 21 is provided with a first fluid port 211 and a second fluid port 212 which are operatively coupled through a fluid channel 215.

Figure 5A:
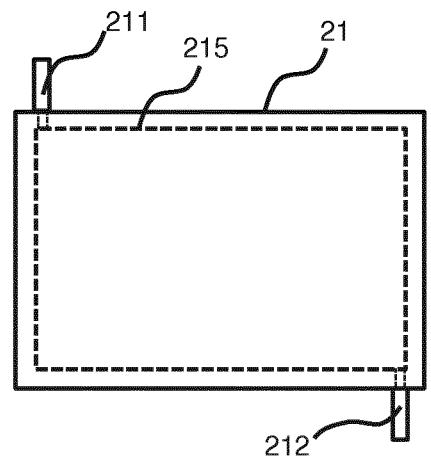
FIG. 5A depicts a first embodiment of a shield element suitable for use in the first embodiment of the radiation shielding device of FIGS. 2A and 2B.

FIG. 5A shows a first embodiment of the shield element 21. In the first embodiment, the fluid channel 215 is a hollow space in the shield element 21. A fluid may enter through either the first fluid port 211 or the second fluid port 212, which may be suitably selected by the skilled person based on application, requirements and any other considerations. In the first embodiment, the fluid flows through the hollow space 215 and preferably fills the hollow space 215 such that the outer surfaces of the shield element 21 are each maintained at a same temperature over their respective surfaces. As apparent to those skilled in the art, in order to obtain an equal temperature over the whole surface, it may be desirable to use a thermally conductive material to form the outer surface of the shield element 21. Still, it is believed to be within the ambit of the skilled person to select a suitable material for forming the shield element 21.

Figure 5B:
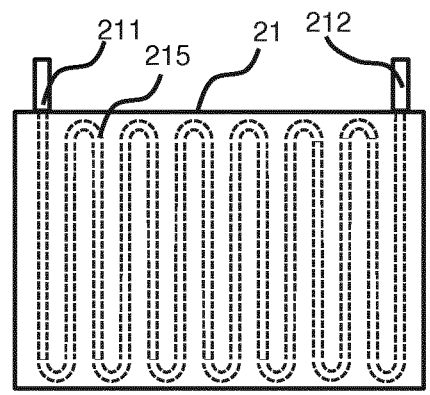
FIG. 5B depicts a second embodiment of a shield element suitable for use in the first embodiment of the radiation shielding device of FIGS. 2A and 2B, FIGS. 5C-5D depict a third embodiment of a shield element suitable for use in the first embodiment of the radiation shielding device of FIGS. 2A and 2B, FIGS. 6A and 6B depict a second embodiment of a radiation shielding device according to the present invention.

FIG. 5B shows a second embodiment of the shield element 21. In this second embodiment, a meandering fluid channel 215 is arranged in the shield element 21. While in the first embodiment, the fluid may fill the hollow space and in some parts of the hollow space a fluid flow may be different from a fluid flow in other parts of the hollow space, in this embodiment, the fluid flow in each part of the fluid channel 215 may be expected to be substantially the same. Further, in this second embodiment, the fluid ports 211, 212 are arranged on a same side of the shield element 21. Positioning the fluid ports for any of the embodiments may be suitably performed by the skilled person in dependence of application, requirements and any other suitable considerations. Similarly, the skilled person may suitably select any other form or shape of the meandering fluid channel 215.

Figure 5C:
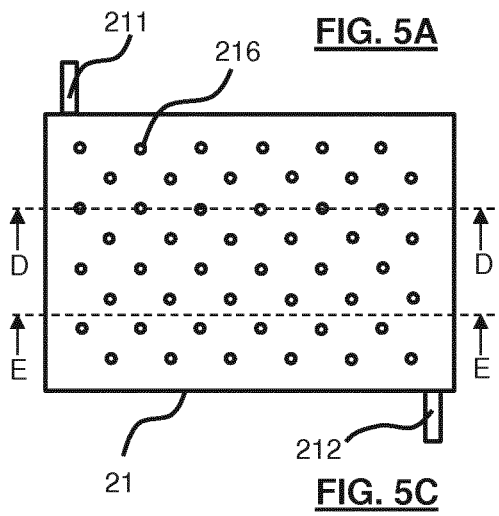
Figure 5D:
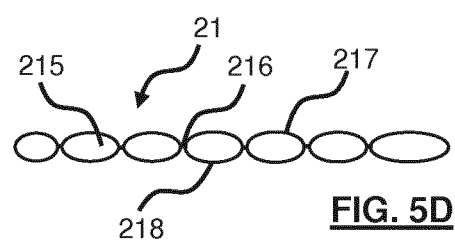
Figure 5E:
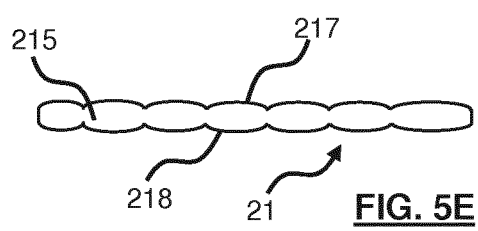

FIGS. 5C-5E show a third embodiment of a shield element 21 for use in the shielding device according to the present invention. The third embodiment may be preferred if a relatively thin shield element 21 is desired. The shield element 21 of the this third embodiment is formed by at least two plates that are bonded at local bonding points 216 and that are spaced apart at other positions. As shown in FIG. 5D, which is a cross-sectional view through a number of such bonding points 216 along the line D-D shown in FIG. 5C, at the bonding points 216, a first plate 217 and a second plate 218 are bonded. Away from the bonding points 216, the plates 217, 218 are spaced apart forming the fluid channel 215. Similarly, in a cross-section along line E-E, as shown in FIG. 5E, the plates 217, 218 may be spaced apart over the whole cross-section to form the fluid channel 215.

This third embodiment is easily and cost-effectively manufacturable, while being relatively thin. For example, the third embodiment of the shield element 21 may be manufactured by positioning two metal plates on top of each other and providing the bonding points 216 by spot welding. After spot welding and bonding the edges of the plates the plates may be spaced apart by applying a gas at a sufficiently high pressure between the plates due to which the plates are pushed apart. A suitable thickness for such a shield element may be about 1 mm. Using a cascade of such shield elements 21 in accordance with the present invention provides for a relatively thin, shielding device with a high heat load suppression and little flow-induced vibrations.

Figure 6A:
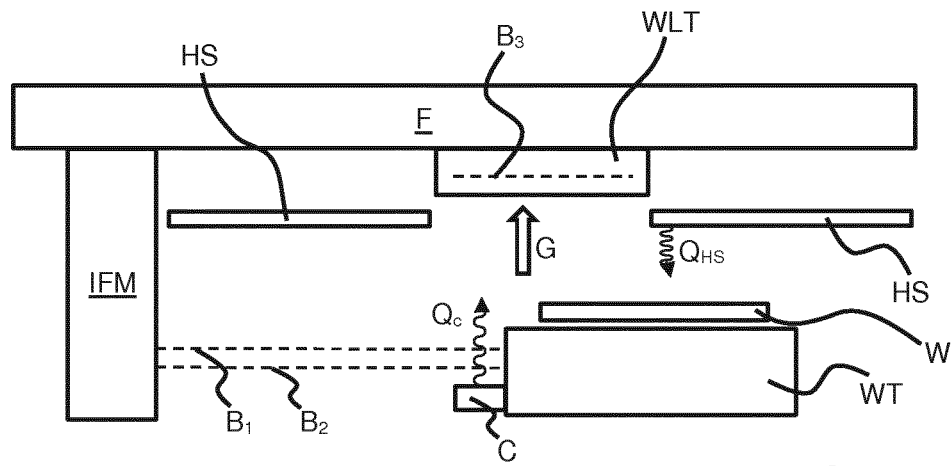

FIG. 6A illustrates a part of a lithographic apparatus and in particular the substrate W held by the substrate table WT. In the illustrated embodiment, the substrate table WT is moveably arranged to enable a scanning operation as well known in the art. For accurate position control an interferometer system IFM is provided. Merely exemplary, a first and a second interferometer measurement beam $B_1$, $B_2$ are shown. In practice, any other number of interferometer beams may be applied depending on the application and corresponding requirements. The interferometer system IFM is supported on a frame F.

To prevent misalignments due to thermal expansion and/or contraction, the frame F is preferably protected against heat load. Thereto, a heat shield HS is provided. The heat shield HS protects the frame F against heat generated during operation of the lithographic apparatus. For example, the patterning beam may generate heat in the substrate W, actuators moving the substrate table WT may generate heat, cabling and tubing connected to the substrate table WT and any other elements may generate heat. For clarity, not all sources of radiation and corresponding heat load on the frame F are illustrated. As an example, a cabling heat load $Q_C$ radiated towards the heat-sensitive frame F is illustrated.

On the other hand, in order to be able to control patterning alignment on the substrate W, heat load to the substrate W is preferably accurately controlled as well. For example, the heat shield HS may be considered to radiate a heat shield heat load $Q_{HS}$ towards the substrate W. While a constant and known heat shield heat load $Q_{HS}$ is acceptable, an unknown and varying heat shield heat load $Q_{HS}$ results in an uncontrollable, and consequently non-compensatable, thermal expansion or contraction of the substrate W, which may be unacceptable.

Further, in the surroundings of the substrate table WT, a gaseous medium may be present providing for a gas pressure. Moreover, a flow of such a gaseous medium may be purposefully generated, for example for thermal control of certain elements or for prevention of contamination of certain elements. As a result and also due to movement of the substrate table WT, local and temporal variations in gas pressure may result. Such gas pressure variations however affect the accuracy of the interferometer system IFM as known in the art. In order to compensate for such inaccuracy due to pressure variations, it is known to apply a wavelength tracking system WLT using a third interferometer beam $B_3$. The wavelength tracking system WLT is preferably mounted to the same frame F and experiencing at least the same gas pressure conditions as the actual interferometer measurement beams $B_1$, $B_2$.

In order for the wave length tracking system WLT to experience same gas pressure conditions, at least a part of the heat shield HS needs to allow a gas flow G of the gaseous medium towards the wave length tracking system WLT. Removal of a part of the heat shield HS results in an opening through which also electromagnetic radiation may pass resulting in a heat load on the frame F. For example, the cabling heat load $Q_C$ may reach the frame F providing an undesired heat load on the frame F, which is a heat-sensitive element.

Figure 6B:
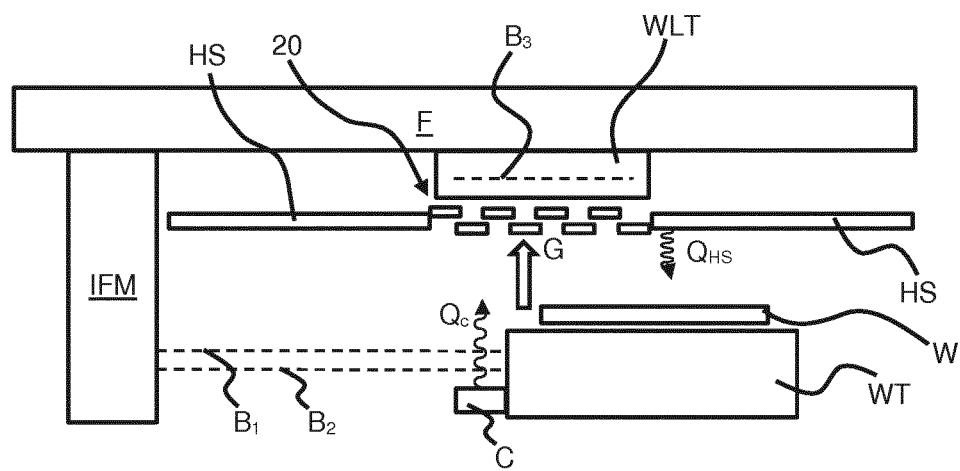

As illustrated in FIG. 6B, an embodiment of a radiation shielding device 20 in accordance with the present invention may be employed as a part of the heat shield HS to prevent the heat load (e.g. cabling heat load $Q_C$) on the frame F, while allowing a gas flow G towards the wave length tracking system WLT such to have a similar gas pressure on both sides of the heat shield HS. In this embodiment of the radiation shielding device 20, each shield element is provided with at least one through hole through which gas may flow. The through holes in different shield elements are however positioned relative to each other such that electromagnetic radiation cannot pass through, thereby preventing a heat load such as the cabling heat load $Q_C$ to be able to reach the frame F. Such an embodiment of the radiation shielding device 20 is illustrated in more detail in FIGS. 7A-7C.

Figure 7A:
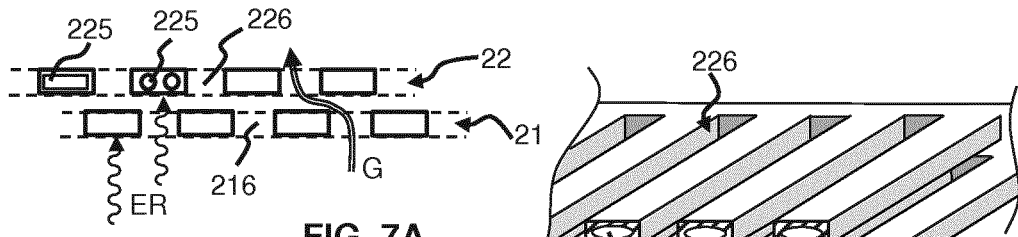
FIGS. 7A and 7B depict a first embodiment of a shield element suitable for use in the second embodiment of the radiation shielding device of FIGS. 6A and 6B.
Figure 7B:
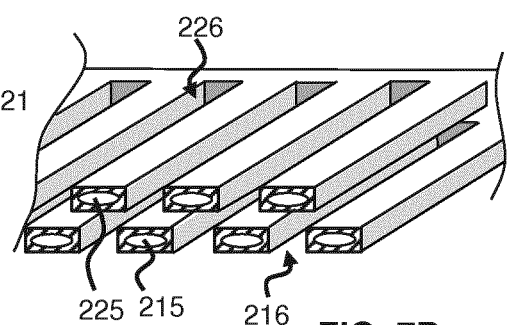

FIGS. 7A and 7B illustrate an embodiment of a radiation shielding device 20 having through holes to allow a gas to pass through the radiation shielding device 20. In particular, the first shield element 21 is provided with through holes 216 and the second shield element 22 has through holes 226. The through holes 216 in the first shield element 21 and the through holes 226 in the second shield element 22 are shifted relative to each other such that the through holes 216 do not overlap with the through holes 226. As a consequence, a gas flow G is enabled, while electromagnetic radiation ER, travelling in a substantially straight direction, impinges on either the first shield element 21 or the second shield element 22.

The first fluid channel 215 and the second fluid channel 225 are illustrated with different cross-sections such as rectangular, circular and elliptical. It is noted any suitable cross-sectional shape of the fluid channels may be used. Similarly, while in the embodiment of FIGS. 7A and 7B tubular elements with a rectangular cross-section are shown, a cross-sectional shape of the tubular elements may be suitably selected by the skilled person as well. For example, as illustrated in FIG. 7C, the shield elements 21, 22 may be formed by tubular elements having a circular cross-section arranged adjacent to each other to form a shield element according to the invention.

Figure 7C:
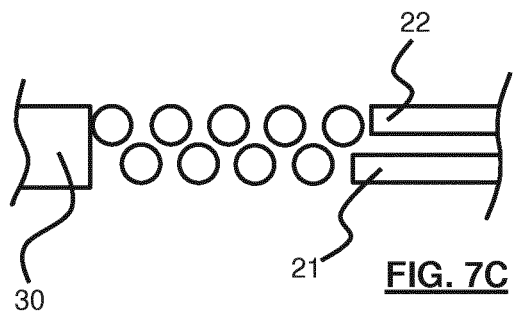
FIG. 7C depicts a second embodiment of a shield element suitable for use in the second embodiment of the radiation shielding device of FIGS. 6A and 6B.

Referring to FIG. 7C, the shielding device 20 having through holes may extend in accordance with the embodiment of FIGS. 2A and 2B having two planar shield elements 21, 22 or may extend as a single-layered heat shield 30, for example.

As apparent to those skilled in the art, while embodiments having two layers of shield elements are shown and described herein, the radiation shielding device according to the present invention may have any suitable number of two or more layers. In particular, in an application requiring low vibration and high heat load suppression, more than two shield elements, e.g. three of four shield elements, may be suitably selected.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography or any other apparatus for any other application in which heat sensitive devices may need to be protected against a heat load from other elements.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus configured to project a pattern from a patterning device onto a substrate, the lithographic apparatus comprising:
   a. a heat-sensitive device;
   b. a radiative element, the radiative element in operation generating electromagnetic radiation, the electromagnetic radiation propagating towards the heat-sensitive device;
   c. a radiation-shielding device arranged between the radiative element and the heat-sensitive device such that, in operation, the electromagnetic radiation impinges on the radiation-shielding device; and
   d. an optical system coupled to the heat-sensitive device and configured to project a patterned beam of electromagnetic radiation on the substrate;
   wherein the radiation-shielding device comprises:
   e. a first shield element having a first fluid channel arranged therein, the first shield element having a first surface and a second surface, the first surface being arranged closer to the radiative element than the second surface; and
   f. a second shield element having a second fluid channel arranged therein, the second shield element having a third surface and a fourth surface, the third surface being arranged closer to the radiative element than the fourth surface; and
   wherein the first shield element is arranged closer to the radiative element than the second shield element, and the second shield element is arranged closer to the heat-sensitive device than the first shield element, the first shield element and the second shield element spaced apart from each other, and the second surface and the third surface opposing each other.

2. The lithographic apparatus according to claim 1, wherein the first shield element is provided with a first fluid port and a second fluid port for flowing a fluid through the first fluid channel and the second shield element is provided with a third fluid port and a fourth fluid port for flowing a fluid through the second fluid channel.

3. The lithographic apparatus according to claim 2, wherein a fluid conditioning system is coupled to the fluid ports of at least one of the first and the second shield element for conditioning the fluid and flowing the fluid through the fluid channel of said at least one of the first and the second shield element.

4. The lithographic apparatus according to claim 2, wherein the second fluid port and the third fluid port are coupled and wherein a fluid conditioning system is coupled to the first fluid port and the fourth fluid port for conditioning the fluid and flowing the fluid through the first and the second fluid channel.

5. The lithographic apparatus according to claim 1, wherein the radiation-shielding device extends in a shielding plane, the shielding plane being transverse to a radiation direction, the radiation direction extending from the radiative element to the heat-sensitive device.

6. The lithographic apparatus according to claim 5, wherein the first shield element is provided with a first through hole, the through hole extending in parallel to the shielding plane, and the second shield element is provided with a second through hole, the second through hole extending in parallel to the shielding plane, and wherein the first through hole and the second through hole are arranged such that the electromagnetic radiation propagating in the radiation direction and passing through the first through hole impinges on the second shield element.

7. The lithographic apparatus according to claim 6, wherein an interferometer system is arranged on a first side of the radiation-shielding device and a wavelength tracking system is arranged on the heat-sensitive device at a second side of the radiation-shielding device, wherein the second side is opposite to the first side.

8. The lithographic apparatus according to claim 1, wherein the patterned beam of electromagnetic radiation comprises EUV radiation having a wavelength in a range of 4-20 nm.

9. The lithographic apparatus according to claim 1, wherein the heat-sensitive device is a frame supporting a part of the optical system.

10. The lithographic apparatus according to claim 1, wherein the radiative element is one of the elements comprised in a group of radiative elements, the group comprising a cable, a tube and an actuator.

11. The lithographic apparatus according to claim 1, wherein the apparatus comprises:

an illumination system configured to condition a radiation beam;

a support structure constructed to support the patterning device, the patterning device being capable of imparting the radiation beam with a pattern in its cross-section to form the patterned beam of electromagnetic radiation;

a substrate table constructed to hold the substrate; and a projection system configured to project the patterned radiation beam onto the substrate.

12. A radiation-shielding device configured for protecting a heat-sensitive device against electromagnetic radiation from a radiative element, the radiation shielding device comprising:

a. a first shield element having a first fluid channel arranged therein, the first shield element having a first surface and a second surface;

b. a second shield element having a second fluid channel arranged therein, the second shield element having a third surface and a fourth surface; and wherein the first shield element and the second shield element are spaced apart from each other and wherein the second surface and the third surface are arranged opposing each other, and wherein the heat-sensitive device is within a lithographic apparatus arranged to project a pattern from a patterning device onto a substrate, the lithographic apparatus being provided with an optical system for projecting a patterned beam of electromagnetic radiation on the substrate, wherein the optical system is coupled to the heat-sensitive device.

13. A method of protecting a heat-sensitive device against electromagnetic radiation from a radiative element, wherein the heat-sensitive device is within a lithographic apparatus arranged to project a pattern from a patterning device onto a substrate, the lithographic apparatus being provided with an optical system for projecting a patterned beam of electromagnetic radiation on the substrate, wherein the optical system is coupled to the heat-sensitive device, the method comprising:

a. arranging a first shield element having a first fluid channel arranged therein between the radiative element and the heat-sensitive device, the first shield element having a first surface and a second surface;

b. arranging a second shield element having a second fluid channel arranged therein between the first shield element and the heat-sensitive device, the second shield element having a third surface and a fourth surface, such that the first shield element and the second shield element are arranged spaced apart from each other and the second surface and the third surface oppose each other; and c. flowing a fluid through the first fluid channel and the second fluid channel.

14. The method according to claim 13, wherein step c further comprises conditioning the fluid flowing through at least one of the first fluid channel and the second fluid channel.

15. The radiation-shielding device according to claim 12, wherein the first shield element is provided with a first fluid port and a second fluid port for flowing a fluid through the first fluid channel, and the second shield element is provided with a third fluid port and a fourth fluid port for flowing a fluid through the second fluid channel.

16. The radiation-shielding device according to claim 12, wherein the radiation-shielding device extends in a shielding plane, the shielding plane being transverse to a radiation direction, the radiation direction extending from the radiative element to the heat-sensitive device.

17. The radiation-shielding device according to claim 12, further comprising a coupling channel through which the first fluid channel and the second fluid channel are operatively coupled.

18. The radiation-shielding device according to claim 12, further comprising a fluid configured to flow through the first fluid channel, the fluid configured to absorb at least a part of the heat generated at the first shield element.

19. The radiation-shielding device according to claim 18, wherein the fluid is configured to flow through the second fluid channel, the fluid configured to absorb at least another part of the heat generated at the second shield element.

* * * * *